United States Patent
Wu et al.

(10) Patent No.: US 7,319,611 B2
(45) Date of Patent: Jan. 15, 2008

(54) BITLINE TRANSISTOR ARCHITECTURE FOR FLASH MEMORY

(75) Inventors: Chu-Ching Wu, Hsinchu (TW); Cheng-Ming Yih, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 51 days.

(21) Appl. No.: 11/339,092

(22) Filed: Jan. 25, 2006

(65) Prior Publication Data

US 2007/0171712 A1    Jul. 26, 2007

(51) Int. Cl.
G11C 11/4063    (2006.01)
G11C 11/4097    (2006.01)
G11C 16/04    (2006.01)
G11C 5/06    (2006.01)

(52) U.S. Cl. .................. 365/185.05; 257/401; 365/51; 365/63

(58) Field of Classification Search ............ None
See application file for complete search history.

(56) References Cited

U.S. PATENT DOCUMENTS

| | | | |
|---|---|---|---|
| 4,647,956 A * | 3/1987 | Shrivastava et al. | 257/373 |
| 4,977,304 A * | 12/1990 | Ino et al. | 250/208.1 |
| 6,166,954 A | 12/2000 | Chern | |
| 6,172,554 B1 | 1/2001 | Young et al. | |
| 6,225,852 B1 | 5/2001 | Cleveland et al. | |
| 6,411,146 B1 | 6/2002 | Kuo | |
| 6,442,099 B1 * | 8/2002 | Kant et al. | 365/230.03 |
| 6,760,248 B2 * | 7/2004 | Stahl | 365/149 |
| 6,800,908 B2 | 10/2004 | Schuelein | |
| 6,914,287 B2 * | 7/2005 | Tran | 257/305 |
| 7,183,193 B2 * | 2/2007 | Husher | 438/618 |
| 2006/0017181 A1 * | 1/2006 | Anezaki et al. | 257/903 |
| 2007/0081383 A1 * | 4/2007 | Yang et al. | 365/177 |

* cited by examiner

Primary Examiner—Amir Zarabian
Assistant Examiner—Michael Weinberg
(74) Attorney, Agent, or Firm—Akin Gump Strauss Hauer & Feld LLP

(57) ABSTRACT

A memory array includes a buried diffusion region, a first source line that supplies electrical power to the buried diffusion region, a second source line that supplies electrical power to the buried diffusion region, a first bitline transistor having a first channel width and a second bitline transistor having a second channel width. The first bitline transistor is proximate to the first source line and is electrically coupled to a first memory cell. The first bitline transistor is disposed between the first and second source lines. The second bitline transistor is proximate to the first bitline transistor and is electrically coupled to a second memory cell. The second bitline transistor is disposed between the first and second source lines and is farther from the first source line than the first bitline transistor. The second channel width is greater than the first channel width.

12 Claims, 2 Drawing Sheets

BITLINE TRANSISTOR ARCHITECTURE FOR FLASH MEMORY

BACKGROUND OF THE INVENTION

The present invention relates to bitline transistor arrangement for flash memory, and more particularly, to a memory array having a plurality of bitline transistors having varying channel widths.

Non-volatile memory ("NVM") refers to semiconductor memory which is able to continually store information even when the supply of electricity is removed from the device containing such an NVM memory cell. NVM includes Mask Read-Only Memory (Mask ROM), Programmable Read-Only Memory (PROM), Erasable Programmable Read-Only Memory (EPROM) and Electrically Erasable Programmable Read-Only Memory (EEPROM). One common form of EEPROM is flash memory. Typically, NVM can be programmed with data, read and/or erased, and the programmed data can be stored for a long period of time prior to being erased, even as long as ten years.

"Flash memory" is a special type of electrically erasable programmable read only memory (EEPROM) that is known in the art. A normal EEPROM only allows one location at a time to be erased or written, meaning that flash memory can operate at higher effective speeds when the system uses it to read and write to different locations at the same time. All types of flash memory and EEPROM wear out after a certain number of erase operations, due to wear on the insulating oxide layer around the charge storage mechanism used to store data. Flash memory is non-volatile, which means that it stores information on a silicon chip in a way that does not need power to maintain the information in the chip. In addition, flash memory offers fast read access times and solid-state shock resistance.

Flash memory typically stores information in an array of transistors, commonly referred to as "cells," each of which traditionally stores one bit of information. Flash memory is based on the Floating-Gate Avalanche-Injection Metal Oxide Semiconductor (FAMOS transistor) which is essentially an n-type Metal Oxide Semiconductor (NMOS) transistor with an additional floating conductor "suspended" by insulating materials between the gate and source/drain terminals.

FIG. 1 is a cross sectional view of a conventional flash memory cell 500. The conventional floating gate flash memory cell 500 includes an n$^+$ type source 504, a p type channel 505, an n$^+$ type drain 512 and a p-type substrate 502. A floating gate 506 is sandwiched between an insulating dielectric layer 510 and thin tunnel oxide layer 514 over the channel 505. The floating gate 506 provides the memory storage element for the flash memory cell 500 and is electrically insulated from other elements of the memory cell 500 by the thin tunnel oxide layer 514 and the insulating dielectric layer 510. Control gate 508 is located on top of the insulating dielectric layer 510 and is positioned over the floating gate 506. The floating gate 506 is electrically isolated from the control gate 508 by the insulating layer 510 such as a layer of silicon dioxide ($SiO_2$). The conventional flash memory cell 500 shown is basically an n-channel transistor with the addition of a floating gate 506. Electrical "access" or coupling to the floating gate 506 takes place only through a capacitor network of surrounding $SiO_2$ layers and source 504, drain 512, channel 505, and control gate 508. Any charge present on the floating gate 506 is retained due to the inherent Si—$SiO_2$ energy barrier height, thereby creating a non-volatile memory.

Typically, the structure of the conventional flash memory cell 500 includes a thin tunneling oxide layer 514 on the order of about 100 angstroms (Å), an abrupt drain junction, a graded source junction, oxide-nitride-oxide (ONO) inter-poly oxide and a short electrical channel length on the order of about 0.3 microns or micrometers (μm). Programming a flash memory cell 500 means that charge (i.e., electrons) is added to the floating gate 506. A high drain to source bias voltage is applied, along with a high control gate voltage $V_g$. The control gate voltage $V_g$ inverts the channel 505, while the drain bias accelerates electrons toward the drain 512. In the process of crossing the channel 505, some electrons collide with the silicon lattice and become redirected toward the Si—$SiO_2$ interface. With the aid of the field produced by the gate voltage $V_g$ some of the electrons travel across the thin oxide layer 514 and become added to the floating gate 506. After programming is completed the electrons added to the floating gate 506 increase the cell's threshold voltage. Programming is selectively performed on each individual cell 500 in an array of cells 500. Reading a flash memory cell 500 is performed using a sense amplifier (not shown). For cells 500 that have been programmed, the turn-on voltage Vt of cells is increased by the increased charge on the floating gate 500. By applying a control gate voltage $V_g$ and monitoring the drain current, differences between a cell with charge and a cell without charge on the respective floating gates can be determined. A sense amplifier compares cell drain current with that of a reference cell such as a flash memory cell 500 which is programmed to the reference level during a manufacturing test. An erased memory cell 500 has more cell current than the reference cell and therefore is a logical "1" whereas a programmed memory cell 500 draws less current than the reference cell and is a logical "0." Erasing a flash memory cell 500 means that electrons (charge) are removed from the floating gate 506. Erasing flash memory is performed by applying electrical voltages to many cells at once so that the cells 500 are erased in a "flash." A typical erase operation in a flash memory cell 500 may be performed by applying a positive voltage to the source 504, a negative or a ground voltage to the control gate 508 and holding substrate 502 of the flash memory cells 500 at ground potential. The drain 512 is allowed to "float." Under these conditions, a high electric field is present between the floating gate 506 and the source 504. The source junction experiences a gated-diode condition during erase and electrons that manage to tunnel through the first few angstroms of the $SiO_2$ of the tunnel oxide layer 514 are then swept into the source 504. After the erase operation has been completed, electrons have been removed from the floating gate 506 thereby reducing the cell threshold voltage Vt. While programming is selective to each individual flash memory cell 500, an erase operation typically includes many flash memory cells 500 in an array being erased simultaneously.

Programming, reading and erasing flash memory cells 500 in a memory array is accomplished by a combination of bitlines and wordlines. Bitline and wordline transistors control voltage and current flow to particular memory cells 500 via the bitlines and wordlines and allow other bitlines to discharge during program, read and erase operations.

U.S. Pat. No. 6,800,908 B2 (Schuelein), the entire contents of which is incorporated by reference herein, discloses an integrated circuit having a voltage generator that selectively increases the voltage potential on a channel region of a transistor relative to a source region of the transistor. Schuelein recognized that as the gate length of a transistor is reduced, the distance between the current carrying electrodes (e.g., source and drain terminals) may also be proportionately reduced. As noted by Schuelein, as the length of the channel region of a transistor is reduced, the electric field of the drain terminal may have a greater effect upon the flow of current in the channel region and reductions in channel length may make it more difficult to control the flow of current across the channel region between the source and drain terminals and lead to an increase in the amount of source-to-drain leakage.

It is desirable to reduce memory array loading effect and memory cell source-side voltage drop from a source-line contact caused by body resistance in a flash memory. It is desirable to provide a memory array having a plurality of bitline transistors having varying channel widths.

BRIEF SUMMARY OF THE INVENTION

Briefly stated, the present invention comprises a memory array includes a buried diffusion region, a first source line that supplies electrical power to the buried diffusion region, a second source line that supplies electrical power to the buried diffusion region, a first bitline transistor having a first channel width and a second bitline transistor having a second channel width. The second source line is generally parallel to and spaced apart from the first source line. The first bitline transistor is proximate to the first source line and is electrically coupled to a first memory cell. The first bitline transistor is disposed between the first and second source lines. The second bitline transistor is proximate to the first bitline transistor and is electrically coupled to a second memory cell. The second bitline transistor is disposed between the first and second source lines and is farther from the first source line than the first bitline transistor. The second channel width is greater than the first channel width.

The present invention also comprises a memory array including a semiconductor substrate, a buried diffusion region disposed in the semiconductor substrate, a source line that supplies electrical power to the buried diffusion region, a plurality of memory cells disposed in the semiconductor substrate and a plurality of bitline transistors each having a channel width. The plurality of memory cells are electrically coupled to the source line through at least a portion of the buried diffusion region. The plurality of bitline transistors are spaced apart from one another and from the source line. Each of the plurality of bitline transistors is electrically coupled to a respective one of the plurality of memory cells. The channel width of each of the plurality of bitline transistors is progressively wider for each of the plurality of bitline transistors that are farther from the source line.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
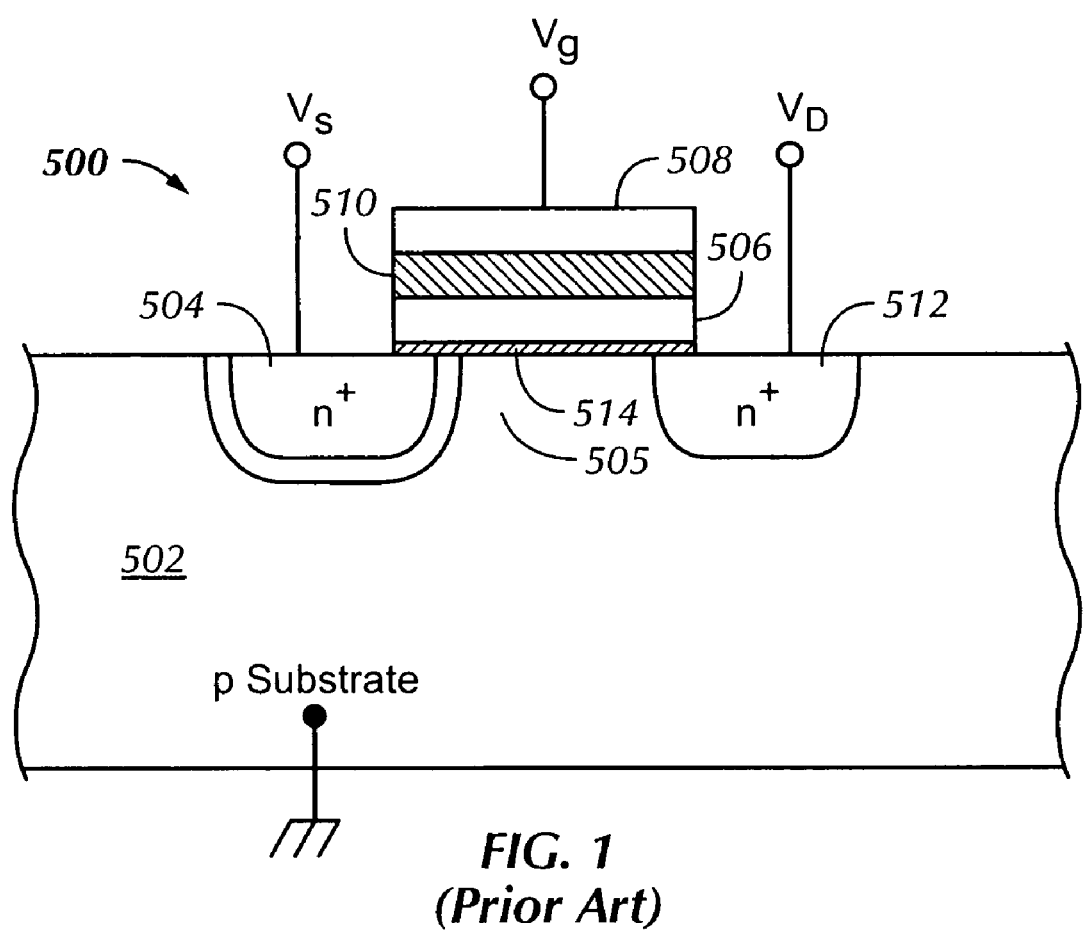
FIG. 1 is a cross sectional view of a conventional flash memory cell.

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, the word "a," as used in the claims and in the corresponding portions of the specification, means "at least one."

Figure 2:
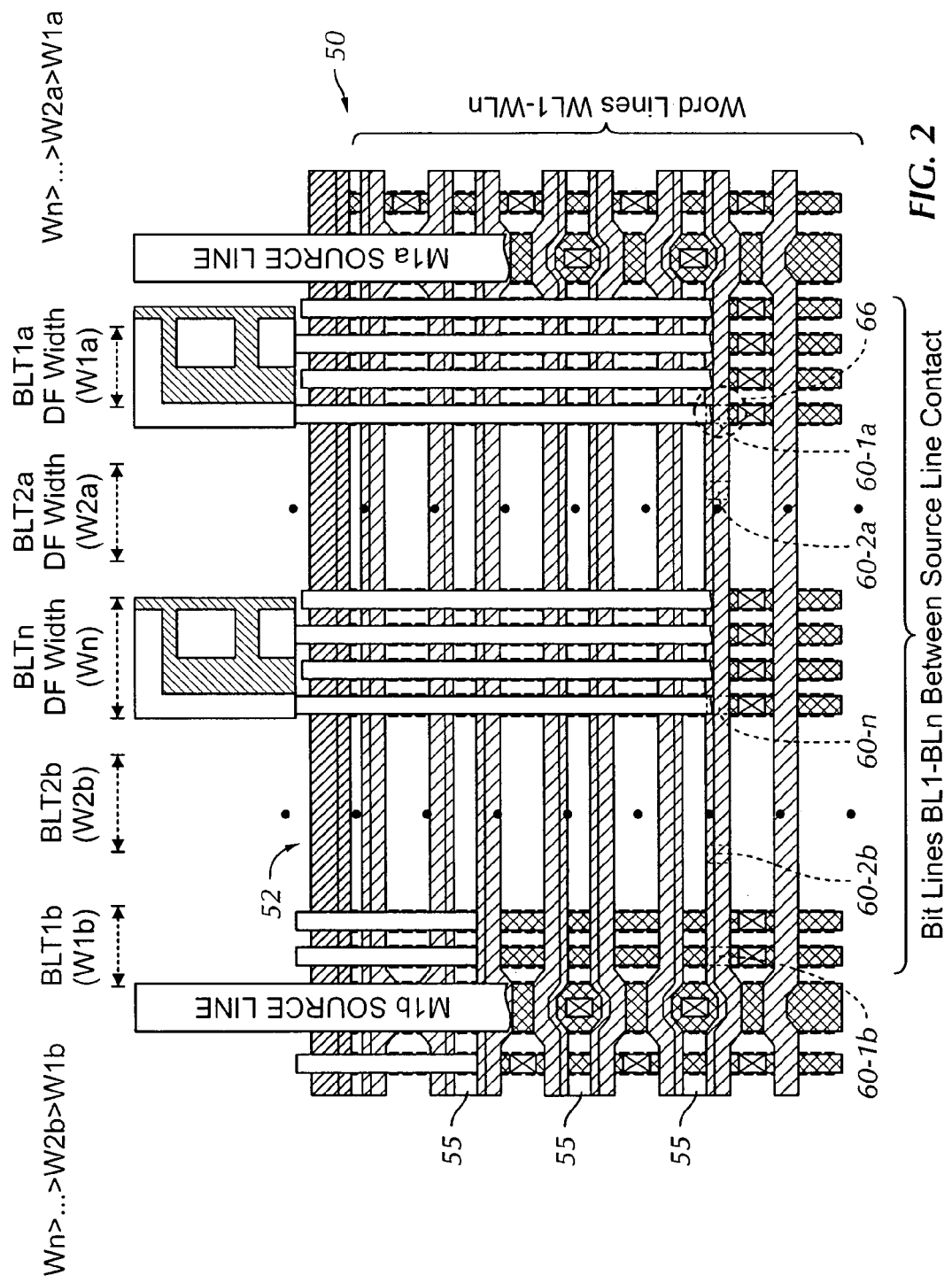
FIG. 2 is a top plan view of a portion of a flash memory array having a plurality of bitline transistors in accordance with the preferred embodiment of the present invention.

Referring to the drawings in detail, wherein like reference numerals indicate like elements throughout, there is shown in FIG. 2 a memory array 50 having a plurality of bitline transistors BLT1-BLTn and a plurality of memory cells 60-1a, 60-2a, 60-n, 60-1b, 60-2b in accordance with the preferred embodiment of the present invention.

The memory array 50 includes a semiconductor substrate 52 having buried diffusion region(s) 55. The memory array 50 also includes a first source line M1a that supplies electrical power to the buried diffusion region 55, a second source line M1b that supplies electrical power to the buried diffusion region 55, a plurality of wordlines WL1-WLn and a plurality of bitlines BL1-BLn. The plurality of memory cells 60-1a, 60-2a, 60-n, 60-1b, 60-2b are disposed in the buried diffusion region 55 and are electrically coupled to the source lines M1a, M1b through at least a portion of the buried diffusion region 55. The second source line M1b is generally parallel to and spaced apart from the first source line M1a. The first and second source lines M1a, M1b provide source voltage to the buried diffusion region 55 of the memory array 50. Generally, the first and second source lines M1a, M1b provide approximately the same source voltage potential.

The plurality of wordlines WL1-WLn are generally parallel to and spaced apart from one another. The plurality of bitlines BL1-BLn are generally parallel to and spaced apart from one another. The plurality of wordlines WL1-WLn are generally perpendicular to the source lines M1a, M1b and to the plurality of bitlines BL1-BLn so that the plurality of wordlines WL1-WLn and the plurality of bitlines BL1-BLn form a matrix of intersecting connections 66. Each of the intersecting connections 66 is over each respective memory cell 60-1a, 60-2a, 60-n, 60-1b, 60-2b.

The memory array 50 further includes a first bitline transistor BLT1a having a first channel width W1a, a second bitline transistor BL2a having a second channel width W2a and a third bitline transistor BLTn having a third channel width Wn. The first bitline transistor BLT1 a is proximate to the first source line M1a and is electrically coupled to a first memory cell 60-1a. The first bitline transistor BLT1a is disposed between the first and second source lines M1a, M1b. The second bitline transistor BLT2a is proximate to the first bitline transistor BLT1a and is electrically coupled to a second memory cell 60-2a. The second bitline transistor BLT2a is disposed between the first and second source lines M1a, M1b and is farther from the first source line M1a than the first bitline transistor BLT1a. The third bitline transistor BLTn is proximate to the second bitline transistor BLT2a and is electrically coupled to a third memory cell 60-n. The second bitline transistor BLT2a is disposed between the first and third bitline transistors BLT1a, BLTn. The third bitline transistor BLTn is disposed between the first and second source lines M1a, M1b and is farther from the first source line M1a than the first and second bitline transistors BLT1a, BLT2a.

The second channel width W2a is greater than the first channel width W1a. The third channel width Wn is greater than the first and second channel widths W1a, W2a. The second channel width W2a is sized to compensate for source-side voltage drop between the first and/or second source lines M1a, M1b and the second memory cell 60-2a. Preferably, the second channel width W2a is sized so that the second memory cell 60-2a receives substantially the same voltage as the first memory cell 60-1a. The third channel width Wn is sized to compensate for source-side voltage drop between the first source line and/or second source line M1a, M1b and the third memory cell 60-n. Preferably, the third channel width Wn is sized so that the third memory cell 60-n receives substantially the same voltage as the first and second memory cells 60-1a, 60-2a.

Similarly, the memory array 50 further includes a fourth bitline transistor BLT1b having a fourth channel width W1b and a fifth bitline transistor BL2b having a fifth channel width W2b. The fourth bitline transistor BLT1b is proximate to the second source line M1b and is electrically coupled to a fourth memory cell 60-1b. The fourth bitline transistor BLT1b is disposed between the first and second source lines M1a, M1b. The fifth bitline transistor BLT2b is proximate to the fourth bitline transistor BLT1b and is electrically coupled to a fifth memory cell 60-2b. The fifth bitline transistor BLT2b is disposed between the first and second source lines M1a, M1b. The fifth bitline transistor BLT2b is disposed between the third and fourth bitline transistors BLTn, BLT1b. The fifth bitline transistor BLT2b is farther from the second source line M1b than the fourth bitline transistor BLT1b. The third bitline transistor BLTn is disposed between the first and second source lines M1a, M1b and is farther from the second source line M1b than the fourth and fifth bitline transistors BLT1b, BLT2b.

The fifth channel width W2b is greater than the fourth channel width W1b. The third channel width Wn is greater than the fourth and fifth channel widths W1b, W2b. The fifth channel width W2b is sized to compensate for source-side voltage drop between the first and/or second source lines M1a, M1b and the fifth memory cell 60-2b. Preferably, the fifth channel width W2b is sized so that the fifth memory cell 60-2b receives substantially the same voltage as the fourth memory cell 60-1b. Preferably, the third channel width Wn is sized so that the third memory cell 60-n receives substantially the same voltage as the fourth and fifth memory cells 60-1b and 60-2b.

Preferably, the first, second, third, fourth and fifth channel widths W1a, W2a, Wn, W1b, W2b are selectively sized so that the first, second, third, fourth and fifth memory cells 60-1a, 60-2a, 60-n, 60-1b, 60-2b receive substantially the same net voltage.

The memory array 50 preferably includes a plurality of bitline transistors BLT1a, BLT2a, BLTn, BLT1b, BLT2b each having a channel width W1a, W2a, Wn, W1b, W2b. The plurality of bitline transistors BLT1a, BLT2a, BLTn, BLT1b, BLT2b are spaced apart from one another and the source lines M1a, M1b. Each of the plurality of bitline transistors BLT1a, BLT2a, BLTn, BLT1b, BLT2b is electrically coupled to at least one of the source lines M1a, M1b through the buried diffusion region 55 of the memory array 50 and the respective memory cells 60-1a, 60-2a, 60-n, 60-1b, 60-2b. The channel width W1a, W2a, Wn, W1b, W2b of each of the plurality of bitline transistors BLT1a, BLT2a, BLTn, BLT1b, BLT2b is progressively wider for each of the plurality of bitline transistors BLT1a, BLT2a, BLTn, BLT1b, BLT2b that are farther from each source line M1a, M1b.

More particularly, the channel width W1a of the bitline transistor BLT1a closest to the first source line M1a is narrower than the channel width W2a of the next bitline transistor BLT2a, and the channel width W2a of the next bitline transistor BLT2a is narrower than the channel width Wn of the next bitline transistor BLTn. The bitline transistor BLTn that is disposed approximately equidistantly from the first and second source lines M1a, M1b has the largest channel width Wn. The bitline transistor BLT1a, BLT1b closest to the first and second source lines M1a, M1b, respectively, has the narrowest channel width W1a, W1b (i.e., W1a<W2a<Wn and W1b<W2b<Wn). The largest channel width Wn of bitline transistor BLTn is arranged generally in the middle of two adjacent source lines M1a, M1b and the smallest channel width W1a, W1b of the bitline transistor BLT1a, BLT1b is closest to the source line M1a, M1b. The variation in the channel widths W1a, W2a, Wn, W1b, W2b of the bitline transistors BLT1a, BLT2a, BLTn, BLT1b, BLT2b, respectively, provides a varying bitline voltage to compensate for the resistive loading effect of the buried diffusion region 55 of the memory array 50. The memory array 50 having bitline transistors BLT1a, BLT2a, BLTn, BLT1b, BLT2b with varying channel widths (W1a<W2a<Wn and W1b<W2b<Wn) provides lower bitline transistor loading and effectively higher bitline voltage which can thereby compensate for source-side voltage drop caused by the resistance of the buried diffusion region 55 and the distance from the source lines M1a, M1b. Thus, the variation in the channel widths W1a, W2a, Wn, W1b, W2b of the bitline transistors BLT1a, BLT2a, BLTn, BLT1b, BLT2b improves the uniformity and performance of the memory array 50.

From the foregoing, it can be seen that the present invention is directed to a memory array 50 having a plurality of bitline transistors BLT1a, BLT2a, BLTn, BLT1b, BLT2b having varying channel widths W1a, W2a, Wn, W1b, W2b (i.e., W1a<W2a<Wn and W1b<W2b<Wn) to compensate for source-side voltage drop. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A memory array comprising:
   a buried diffusion region;
   a first source line that supplies electrical power to the buried diffusion region; a second source line that supplies electrical power to the buried diffusion region, the second source line being generally parallel to and spaced apart from the first source line;
   a first bitline transistor having a first channel width, the first bitline transistor being disposed between the first and second source lines and proximate to the first source line and being electrically coupled to a first memory cell disposed in the buried diffusion region; and
   a second bitline transistor having a second channel width, the second bitline transistor being proximate to the first bitline transistor and being electrically coupled to a second memory cell disposed in the buried diffusion region, the second bitline transistor being disposed between the first and second source lines farther from the first source line than the first bitline transistor, the second channel width being greater than the first channel width.

2. The memory array according to claim 1, further comprising:
a third bitline transistor having a third channel width, the third bitline transistor being proximate to the second bitline transistor and being electrically coupled to a third memory cell, the third bitline transistor being disposed between the first and second source lines farther from the first source line than the first and second bitline transistors, the third channel width being greater than the first and second channel widths.

3. The memory array according to claim 2, wherein the third channel width is sized to compensate for source-side voltage drop between at least one of the first and second source lines and the third memory cell.

4. The memory array according to claim 3, wherein the third channel width is sized so that the third memory cell receives substantially the same voltage as the first and second memory cells.

5. The memory array according to claim 1, wherein the second channel width is sized to compensate for source-side voltage drop between at least one of the first and second source lines and the second memory cell.

6. The memory array according to claim 5, wherein the second channel width is sized so that the second memory cell receives substantially the same voltage as the first memory cell.

7. The memory array according to claim 1, wherein the first and second channel widths are selectively sized so that the first and second memory cells receive substantially the same voltage.

8. A memory array comprising:
a semiconductor substrate;
a buried diffusion region disposed in the semiconductor substrate;
a first source line that supplies electrical power to the buried diffusion region;
a second source line that supplies electrical power to the buried diffusion region, the second source line being generally parallel to and spaced apart from the first source line;
a plurality of memory cells disposed in the semiconductor substrate and electrically coupled to the first source line and the second source line through at least a portion of the buried diffusion region; and
a plurality of bitline transistors each having a channel width, the plurality of bitline transistors being spaced apart from one another and between the first source line and the second source line, each of the plurality of bitline transistors being electrically coupled to a respective one of the plurality of memory cells, the channel width of each of the plurality of bitline transistors being progressively wider for each of the plurality of bitline transistors that are farther from the first source line and the second source line.

9. The memory array according to claim 8, wherein channel width of each of the plurality of bitline transistors is sized to compensate for source-side voltage drop between the source line and one of the plurality of memory cells.

10. The memory array according to claim 9, wherein the channel widths of the plurality of bitline transistors are selectively sized so that each of the plurality of memory cells receives substantially the same voltage.

11. A memory array comprising:
a buried diffusion region;
a first source line that supplies electrical power to the buried diffusion region;
a second source line that supplies electrical power to the buried diffusion region, the second source line being generally parallel to and spaced apart from the first source line;
a first bitline transistor having a first channel width, the first bitline transistor being disposed between the first and second source lines and proximate to the first source line and being electrically coupled to a first memory cell disposed in the buried diffusion region;
a second bitline transistor having a second channel width, the second bitline transistor being proximate to the first bitline transistor and being electrically coupled to a second memory cell disposed in the buried diffusion region, the second bitline transistor being disposed between the first and second source lines farther from the first source line than the first bitline transistor, the second channel width being greater than the first channel width;
a third bitline transistor having a third channel width, the third bitline transistor being proximate to the second bitline transistor and being electrically coupled to a third memory cell disposed in the buried diffusion region, the third bitline transistor being disposed between the first and second source lines farther from the first source line than the first and second bitline transistors, the third channel width being greater than the first and second channel widths;
a fourth bitline transistor having a fourth channel width, the fourth bitline transistor being proximate to the second source line and being electrically coupled to a fourth memory cell disposed in the buried diffusion region, the fourth bitline transistor being disposed between the first and second source lines; and
a fifth bitline transistor having a fifth channel width, the fifth bitline transistor being disposed between the first and second source lines and proximate to the fourth bitline transistor and being electrically coupled to a fifth memory cell disposed in the buried diffusion region and farther from the second source line than the fourth bitline transistor, the fifth channel width being greater than the fourth channel width.

12. The memory array according to claim 11, wherein the first, second, third, fourth and fifth channel widths are sized so that the first, second, third, fourth and fifth memory cells receive substantially the same voltage.

* * * * *